(12) United States Patent
Le Perchec et al.

(10) Patent No.: US 8,698,207 B2
(45) Date of Patent: Apr. 15, 2014

(54) PHOTODETECTOR HAVING A VERY THIN SEMICONDUCTING REGION

(75) Inventors: Jérôme Le Perchec, Grenoble (FR); Yohan Desieres, Lans en Vercors (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 0 days.

(21) Appl. No.: 13/140,249

(22) PCT Filed: Dec. 14, 2009

(86) PCT No.: PCT/FR2009/052526
§ 371 (c)(1),
(2), (4) Date: Oct. 14, 2011

(87) PCT Pub. No.: WO2010/072942
PCT Pub. Date: Jul. 1, 2010

(65) Prior Publication Data
US 2012/0032292 A1 Feb. 9, 2012

(30) Foreign Application Priority Data
Dec. 24, 2008 (FR) ...................................... 08 59077

(51) Int. Cl.
*H01L 29/78* (2006.01)
(52) U.S. Cl.
USPC .................... 257/216; 257/E31.053; 257/432; 257/431; 257/346
(58) Field of Classification Search
USPC .......... 257/216, E31.053, 432, 431, 436, 346; 438/69
See application file for complete search history.

(56) References Cited

U.S. PATENT DOCUMENTS

| | | | |
|---|---|---|---|
| 7,800,193 B2 * | 9/2010 | Fujikata et al. | 257/449 |
| 7,873,090 B2 * | 1/2011 | Onishi et al. | 372/50.12 |
| 7,883,911 B2 * | 2/2011 | Oohashi et al. | 438/24 |
| 7,923,802 B2 * | 4/2011 | Fattal et al. | 257/448 |
| 8,125,043 B2 * | 2/2012 | Boutami et al. | 257/442 |

(Continued)

FOREIGN PATENT DOCUMENTS

| | | |
|---|---|---|
| EP | 1995793 A | 11/2008 |
| JP | 2006-501638 A | 1/2006 |

(Continued)

OTHER PUBLICATIONS

Pendry "New electromagnetic materials emphasise the negative" Physics world pp. 1-5 2001.*

(Continued)

*Primary Examiner* — Michael Shingleton
(74) *Attorney, Agent, or Firm* — Vedder Price PC

(57) ABSTRACT

The instant disclosure describes a photodetector that includes at least one portion of a semiconducting layer formed directly on at least a portion of a reflective layer and to be illuminated with a light beam, at least one pad being formed on the portion of the semiconducting layer opposite the reflective layer portion, wherein the pad and the reflective layer portion are made of a metal or of a negative permittivity material, the optical cavity formed between said at least one reflective layer portion and said at least one pad has a thickness strictly lower than a quarter of the ratio of the light beam wavelength to the optical index of the semiconducting layer, and typically representing about one tenth of said ratio.

11 Claims, 3 Drawing Sheets

(56) References Cited

U.S. PATENT DOCUMENTS

| | | | |
|---|---|---|---|
| 8,154,063 B2* | 4/2012 | Kim et al. | 257/293 |
| 8,183,656 B2* | 5/2012 | Okamoto et al. | 257/432 |
| 8,373,153 B2* | 2/2013 | Ahn | 257/14 |
| 2005/0247993 A1* | 11/2005 | Yoneda et al. | 257/459 |
| 2006/0072114 A1* | 4/2006 | Sigalas et al. | 356/445 |
| 2006/0151807 A1 | 7/2006 | Pardo et al. | |
| 2006/0175551 A1* | 8/2006 | Fan et al. | 250/353 |
| 2007/0194357 A1* | 8/2007 | Oohashi et al. | 257/292 |
| 2008/0099793 A1* | 5/2008 | Fattal et al. | 257/233 |
| 2009/0176327 A1* | 7/2009 | Oohashi et al. | 438/69 |
| 2010/0308428 A1* | 12/2010 | Okamoto et al. | 257/432 |
| 2011/0110628 A1* | 5/2011 | Okamoto et al. | 385/37 |
| 2011/0156189 A1* | 6/2011 | Gravrand et al. | 257/432 |
| 2011/0156194 A1* | 6/2011 | Gravrand et al. | 257/436 |
| 2011/0177647 A1* | 7/2011 | Fattal et al. | 438/71 |
| 2011/0215231 A1* | 9/2011 | Fattal et al. | 250/237 |
| 2011/0316427 A1* | 12/2011 | Okajima | 315/151 |
| 2012/0006981 A1* | 1/2012 | Van Dorpe et al. | 250/227.11 |
| 2012/0032292 A1* | 2/2012 | Le Perchec et al. | 257/436 |
| 2012/0235028 A1* | 9/2012 | Ahn | 250/216 |

FOREIGN PATENT DOCUMENTS

| | | |
|---|---|---|
| JP | 2007 273832 A | 10/2007 |
| JP | 2007273832 A | 10/2007 |
| WO | 2004012275 A2 | 5/2004 |
| WO | 2008/072688 A | 6/2008 |

OTHER PUBLICATIONS

"High-efficiency and high-speed silicon metal-semiconductor-metal photodetectors operating in the infrared", Applied Physics Letters, AIP, American Institute of Physics, Melville, NY, US, vol. 70, No. 6, Feb. 10, 1997, pp. 753-755, XP012018324.

International Search Report issued in PCT/FR2009/052526 on Jun. 4, 2010.

International Preliminary Report on Patentability dated Aug. 11, 2011 in International Application No. PCT/FR2009/052526.

* cited by examiner

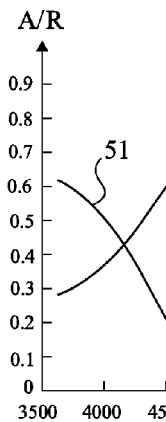
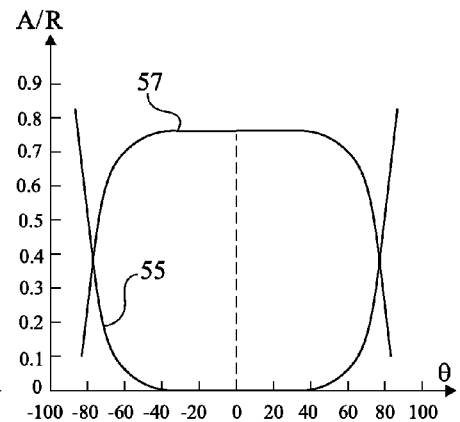
Fig 7A  Fig 7B
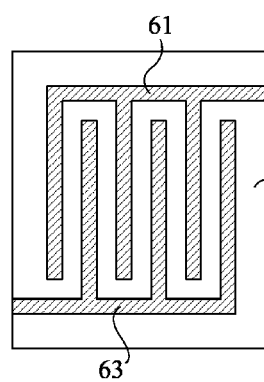
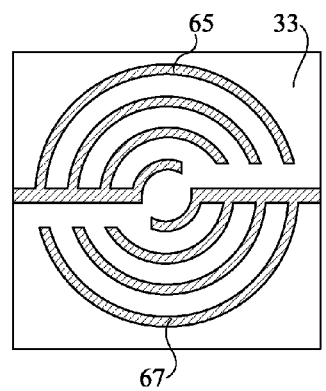
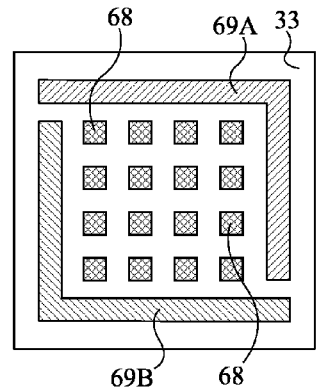
Fig 8A  Fig 8B  Fig 8C
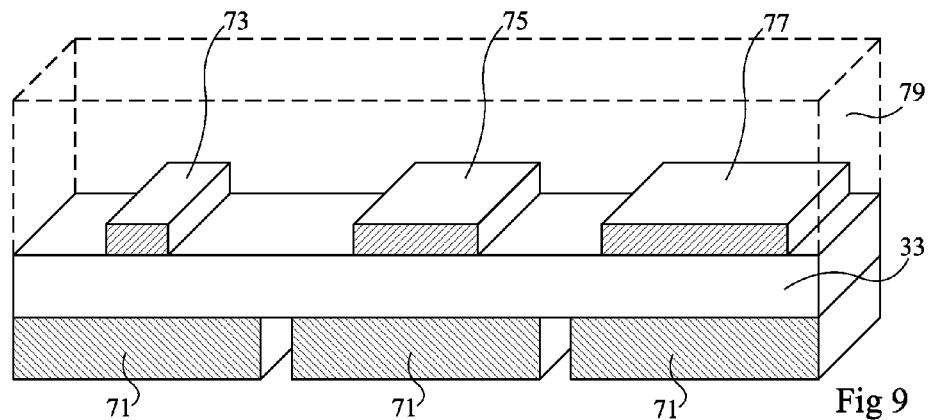
Fig 9

PHOTODETECTOR HAVING A VERY THIN SEMICONDUCTING REGION

FIELD OF THE INVENTION

The present invention relates to a photodetector. The present invention relates to such a photodetector comprising a semiconductor layer having a thickness much smaller than the wavelength of the light which is desired to be detected.

DISCUSSION OF PRIOR ART

Current photodetectors generally comprise a semiconductor layer associated with a charge transfer device. When a light beam lights the semiconductor layer, the incident photons form electron/hole pairs inside of it. Such carriers are then transferred by the charge transfer device to an electronic circuit which enables to quantify them.

The average depth of the forming of electron/hole pairs in a semiconductor layer depends on the wavelength of the incident light beam and on the semiconductor material used: the higher the wavelength, the deeper the electron/hole pairs are likely to form inside of a semiconductor layer. For example, to absorb approximately 99% of red light, it is necessary to have a silicon layer with a thickness of approximately 10 μm. For blue light, a silicon layer having a thickness on the order of 3 μm is sufficient to reach such an absorption rate. It should be noted that these thicknesses are much greater than the wavelength of the light waves which are detected.

The size of the pixels of a photodetector is generally desired to be decreased. The decrease in the surface area taken up by each pixel on the semiconductor layer essentially poses problems of insulation of the photosensitive regions from one another. Indeed, to avoid interferences between neighboring pixels, it is generally provided to form insulating trenches around each of them. If the semiconductor layer is relatively thick, the insulating trenches take up a non-negligible surface area of the semiconductor layer, which is not compatible with the decrease of the general pixel size. The thickness of semiconductor layers thus has to be decreased. However, as indicated previously, the forming of very thin active layers does not enable to absorb and detect the entire incident light.

It has thus been provided to increase the equivalent thickness of the semiconductor layer by having photons cross this layer twice or several times. A mirror can thus be provided on one side of the semiconductor layer to ensure a double crossing thereof. Reflective elements may also be provided on either side of the semiconductor layer to form Fabry-Perot type structures. In practice, the reflective elements are Bragg mirrors which are generally thick, formed for example of a stack of from 10 to 30 quarter-wave layers. The advantage of a decrease in the thickness of the active semiconductor layer is thus lost.

Such devices are especially described in patent application US 2006/151807 where a resonance is created between a lower mirror (Bragg or metal mirror) and an upper metal network forming a mirror. In such a device, the thickness of the cavity between the lower and upper mirrors must be a multiple of one quarter of the ratio between the incident wavelength and the average optical index between the upper and lower mirrors. It is thus impossible to decrease the thickness of this cavity below a given value.

It has then been provided to use another effect to decrease the thickness of photodetection semiconductor layers. This effect comprises taking advantage of physical collective electron oscillation phenomena (plasmon resonances).

In FIG. 1, on a semiconductor substrate 11, many metal strips 13 extend to form, at the surface of substrate 11, a periodic lattice. The photodetector of FIG. 1 is illuminated by a light beam indicated by arrows 15. When period P of the lattice formed of strips 13 is equal to the ratio between the wavelength of light beams 15 and the optical index of semiconductor material 11, surface plasmon resonances appear at the metal-semiconductor interfaces. Such resonances enable to confine photons, and thus the area where electron/hole pairs are formed in substrate 11, in the vicinity of metal strips 13.

However, a structure such as that in FIG. 1 has the disadvantage of being very selective in terms of frequency. Further, the efficiency of such a structure strongly depends on the angle of incidence and on the polarization of light beam 15. Finally, period P must be on the order of the ratio of the wavelength of light beam 15 to the optical index of semiconductor material 11, which does not enable to envisage smaller elementary detectors.

FIG. 2 illustrates another photodetector comprising very thin semiconductor regions 21 which extend vertically between metal regions 23. The photodetector is illuminated by a light beam 25. Surface plasmon resonances coupled between two opposite semiconductor-metal interfaces appear in this metallic photodetector with vertical semiconductor cavities However, in order for coupled surface plasmon resonances to form between two opposite semiconductor-metal interfaces, semiconductor cavities 21 must be very narrow, with a thickness much smaller than the wavelength of the considered light. A problem is then posed for the manufacturing of this structure.

There thus is a need for a photodetector which is less frequency-selective than known plasmon resonance photodetectors, less dependent on the polarization and on the angle of incidence of the light beam to be detected, and which has a size that can be much smaller than the wavelength of the incident light beam.

It is further desirable to be able to form photodetectors in which the semiconductor material can be selected from among a wide range of semiconductor compounds, some of which can only be deposited in an extremely thin layer.

SUMMARY

An object of an embodiment of the present invention is to provide a photodetector comprising a very thin semiconductor layer and having at least one of the following features:
  less frequency-selective than known plasmon resonance devices, that is, with an absorption spectrum having a width at mid-height on the order of one third of the wavelength to be detected;
  little sensitive to the angle of incidence of the incident light beam;
  little sensitive to the polarization of the incident light beam;
  capable of selecting one of the two fundamental polarizations; and
  having dimensions smaller than the wavelength of a light beam to be detected.

Thus, an embodiment of the present invention provides a photodetector comprising at least a portion of a semiconductor layer formed directly on at least a portion of a reflective layer and intended to be illuminated by a light beam, at least one pad being formed on the portion of the semiconductor layer, opposite to the reflective layer portion, the pad and the portion of the reflective layer being metallic or made of a material having a negative permittivity, the optical cavity formed between said at least a portion of the reflective layer and said at least one pad has a thickness strictly smaller than one quarter of the ratio of the wavelength of the light beam to the optical index of the semiconductor layer, typically on the order of one tenth of this ratio.

According to an embodiment of the present invention, at least one dimension of the pad, in a plane parallel to the semiconductor layer, is smaller than the ratio of the wavelength of the light beam to twice the optical index of the semiconductor layer.

According to an embodiment of the present invention, the portion of the semiconductor layer comprises a horizontal or vertical PN or PIN junction.

According to an embodiment of the present invention, several pads, of square or rectangular shape, are formed at the surface of the portion of the semiconductor layer, the pads being arranged periodically according to a period smaller than $0.75\lambda/n$, $\lambda$ being the wavelength of said light beam, n being the optical index of the semiconductor layer.

According to an embodiment of the present invention, a layer of a transparent material covers the photodetector.

According to an embodiment of the present invention, the photodetector further comprises a bonding layer, which may also or as an alternative be a layer with an index gradient at the interface between the reflective layer and the semiconductor layer.

According to an embodiment of the present invention, the pad(s) and the reflective layer are made of a metal capable of creating, when the semiconductor layer is illuminated, a cavity plasmon mode in this semiconductor layer.

According to an embodiment of the present invention, the reflective layer is made of a metal having a thickness greater than the skin depth of this metal, for the wavelength of said light beam.

According to an embodiment of the present invention, the metal pad(s) have a thickness ranging between once and three times the skin depth of the metal forming them, for the wavelength of said light beam.

According to an embodiment of the present invention, the pad(s) and the reflective layer are made of a material having a negative permittivity, for example, an ionic crystal, intended to form, when the semiconductor layer is illuminated, phonons at the interface between said material and the semiconductor layer.

Another embodiment of the present invention provides a multispectral image sensor comprising several elementary photodetectors such as described hereabove, the dimensions of the pad(s) of each elementary photodetector being adapted to the spectrum to be detected.

BRIEF DESCRIPTION OF THE DRAWINGS

The foregoing and other objects, features, and advantages of the present invention will be discussed in detail in the following non-limiting description of specific embodiments in connection with the accompanying drawings:

FIGS. 7A and 7B are curves illustrating advantages of a photodetector according to an embodiment of the present invention;

FIGS. 8A, 8B, and 8C illustrate three possible shapes of the upper pads of a photodetector according to an embodiment of the present invention; and FIG. 9 illustrates a variation of a photodetector according to an embodiment of the present invention.

For clarity, the same elements have been designated with the same reference numerals in the different drawings and, further, as usual in the representation of semiconductor devices, the various drawings are not to scale.

DETAILED DESCRIPTION

The present inventors provide a photodetector comprising a very thin semiconductor layer having an improved absorption. For this purpose, they have a structure of vertical metal-semiconductor-metal type, which further has the advantage of being little sensitive to the angle of incidence and to the optical frequency of the incident light beam, as will be seen hereafter. This structure may also be configured to be little dependent on the polarization of the incident light beam or to select one of the two fundamental polarizations of the incident light beam.

In the foregoing and in the following description, it is spoken of the creation of surface plasmon resonances or of plasmon modes at the interface between a metal and a semiconductor material. It should be noted that structures similar to those discussed herein, in which the metal regions are replaced with regions of a material having a negative permittivity in the considered spectral field may also be provided. Such materials are for example very heavily-doped semiconductor materials, or again ionic crystals such as silicon carbide. The forming of regions made of one of these materials rather than of a metal enables to form surface phonon resonances rather than surface plasmon resonances. It should be noted that these two resonances cause similar effects on the incident light photons.

Figure 1:
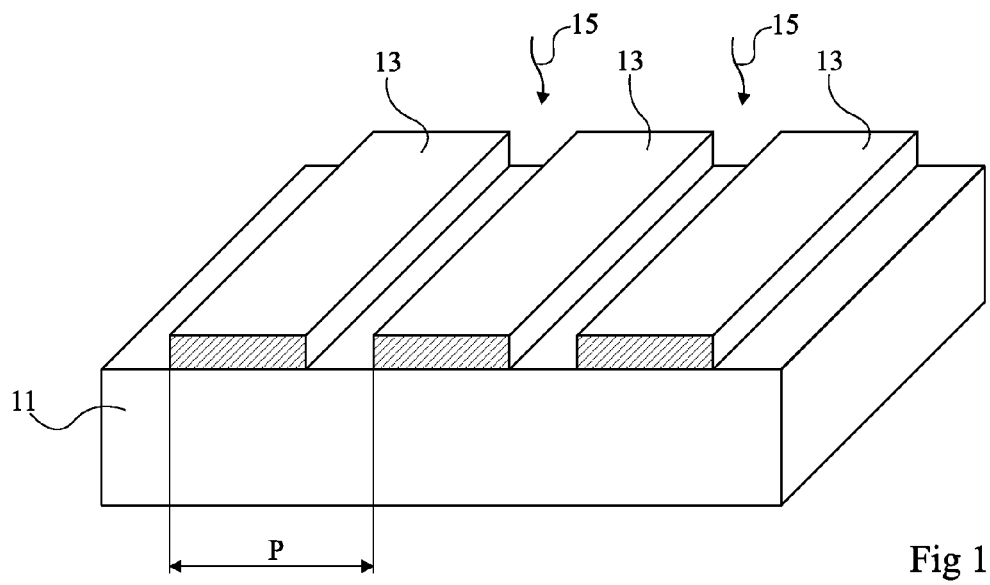
FIGS. 1 and 2, previously described, illustrate two known plasmon resonance photodetectors allowing the absorption of light beams in thin semiconductor layers.
Figure 2:
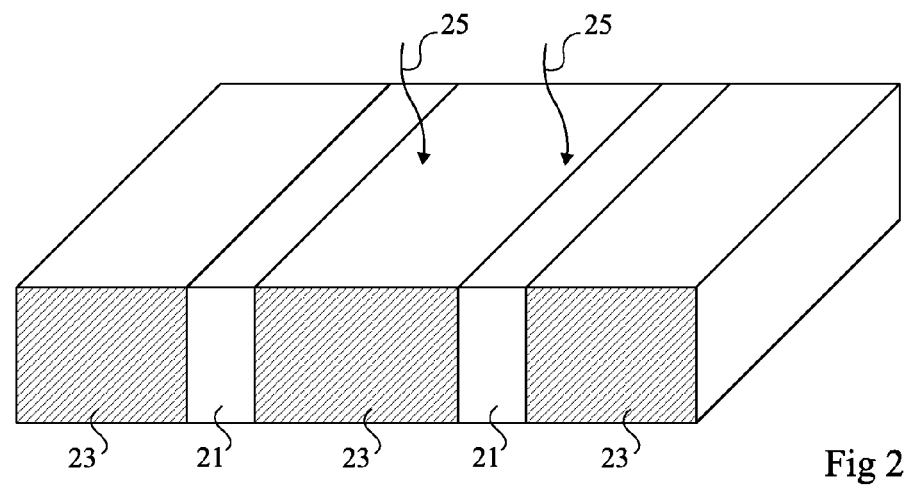
Figure 3:
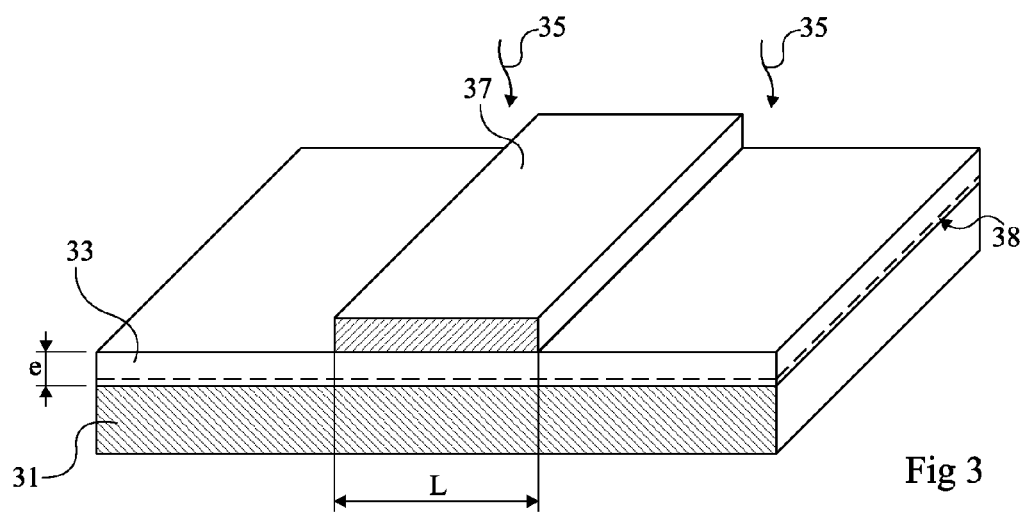
FIG. 3 illustrates a plasmon resonance photodetector according to an embodiment of the present invention.

FIG. 3 illustrates an embodiment of a plasmon resonance photodetector.

On a metal layer 31 is formed a layer of a semiconductor material 33 having a thickness e strictly smaller than one quarter of the ratio between the wavelength of a light beam illuminating the device (arrows 35) and the optical index of semiconductor layer 33. It should be noted that semiconductor layer 33 will preferably have a thickness on the order of one tenth of this ratio. Semiconductor layer 33 is for example made of silicon, of germanium, of a III-V compound or again of a material with a small bandgap such as InSb or CdHgTe-type compounds. The use of one or the other of these materials to form semiconductor layer 33 depends on the wavelength of the light beam which is desired to be detected. Indeed, these different materials enable to cover a wavelength range extending from close ultraviolet (400 nm) to infrared (15 μm).

On semiconductor layer 33 is formed a metal pad 37, opposite to metal layer 31. Thus, semiconductor layer 33, sandwiched between metal layer 31 and pad 37, defines an optical cavity. The photodetector is illuminated on the surface comprising semiconductor layer 33 and metal pad 37, as shown in FIG. 3 by arrows 35. Metal layer 31 preferably has a thickness greater than the skin depth of the metal forming it at the frequency of light beam 35, the skin depth of the metal being the thickness above which a light field no longer propagates into the metal. Metal pad 37 preferably has a thickness ranging between once and three times the skin depth of the metal forming it at this same frequency. As an example, the metal of pad 37 and of layer 31 may be gold, silver, aluminum, or again an alloy of these materials having similar optical properties. In the shown example, pad 37 has a rectangular shape in top view.

The structure of FIG. 3 enables to use the electromagnetic resonance appearing within the metal-semiconductor-metal sandwich to reinforce the absorption of semiconductor layer 33, metal layer 31 and metal pad 37 forming a plasmonic resonator of horizontal cavity type (the cavity plasmons form between pad 37 and layer 31). The cavity plasmon resonances enable, in known fashion, to confine the incident photons in semiconductor layer 33, between metal pad 37 and metal layer 31. For the photodetector to operate properly and the cavity plasmon modes to form, width L of pad 37 must be such that:

$$L \approx \frac{\lambda}{2 \cdot n_{eff}} - \Delta(\lambda),\qquad \text{(Equation 1)}$$

$n_{eff}$ being the effective optical index of the plasmon mode, greater than the optical index of semiconductor layer 33, $\Delta(\lambda)$ being a positive term which reflects the spectral shift linked to phase shifts or to absorptions in the photodetector. More simply, the width of pad 37 must be such that:

$$L < \frac{\lambda}{2 \cdot n_{eff}}.\qquad \text{(Equation 2)}$$

As will be seen hereafter, a photodetector such as that in FIG. 3, having dimensions in accordance with equation (1) or (2) and with an optical cavity between metal layer 31 and metal pad 37 (semiconductor layer 33) having a thickness smaller than one quarter of the ratio of the wavelength of light beam 35 to the optical index of semiconductor layer 33, has the advantage of having a significant absorption, even if the wavelength of the light beam varies slightly.

A bonding layer 38, delimited in FIG. 3 by dotted lines, may be provided between metal layer 31 and semiconductor layer 33 to allow a proper bonding between the two layers. Layer 38 may also be a thin layer with an index gradient or a passivation layer, avoiding parasitic recombinations of photo-carriers at the metal interfaces. It should be noted that, in the following alternative embodiments, this layer, although not shown and described, may be present.

Figure 4:
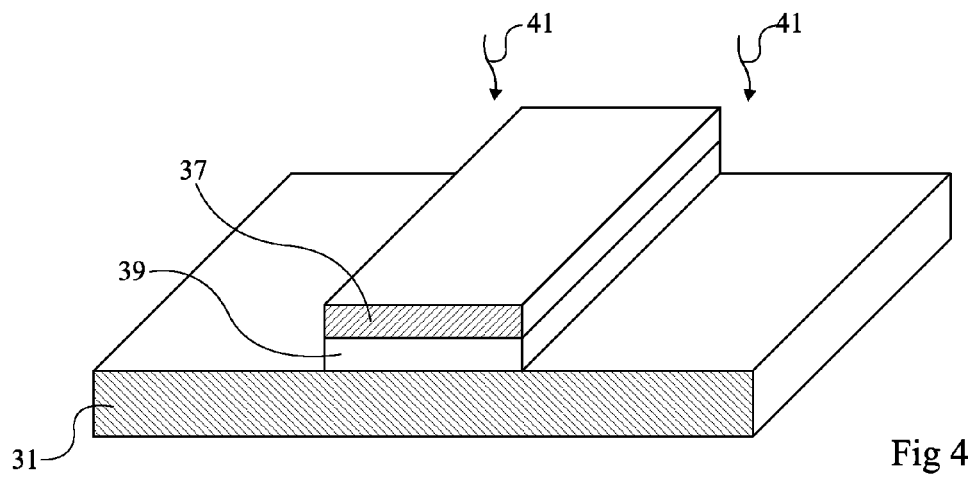
FIGS. 4, 5, and 6 illustrate variations of a photodetector according to an embodiment of the present invention.

FIG. 4 illustrates a variation of the photodetector of FIG. 3. On metal layer 31 is formed of a pad of semiconductor material 39 covered with a metal pad 37. As in the case of the structure of FIG. 3, surface plasmon modes form in semiconductor pad 39, at the interface between metal pad 37 and the semiconductor pad and at the interface between metal layer 31 and semiconductor pad 39, when the photodetector is illuminated by a light beam 41 of adapted wavelength. The forming of the plasmon modes allows a better absorption in semiconductor pad 39. The plasmon modes in semiconductor pad 39 appear when the width of metal pad 37 and the wavelength of the light beam comply with equation (1) or (2).

Figure 5:
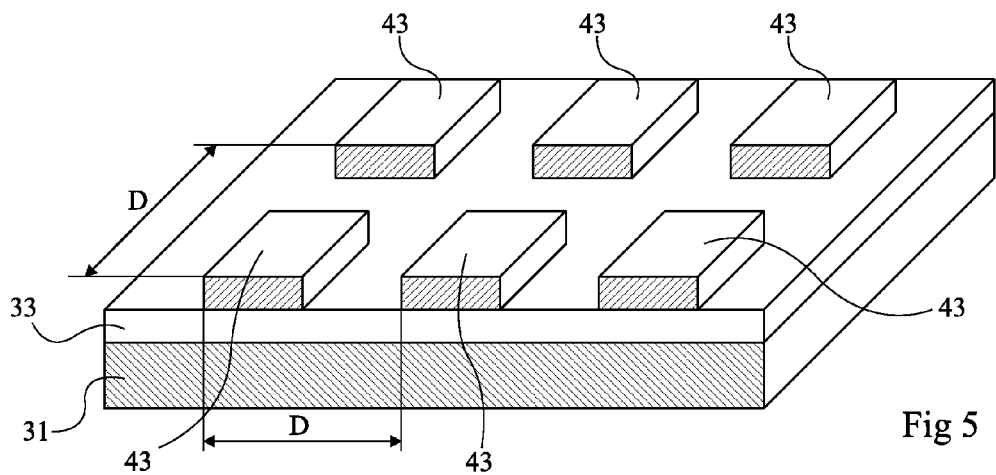

FIG. 5 illustrates an alternative photodetector in which several pads are formed at the surface of a same semiconductor layer. On a metal layer 31 is formed a thin semiconductor layer 33. On semiconductor layer 33 are formed many metal pads 43. In the shown example, pads 43 are, in top view, square, and are formed periodically at the surface of semiconductor layer 33. Each dimension of metal pads 43 at the surface of semiconductor layer 33 complies with equation (1) or (2). The periodization of pads 43 enables to form larger photodetectors.

In the case of a periodic distribution of pads 43 at the surface of silicon layer 33, period D of the array must be such that:

$$D < \frac{3}{4}\frac{\lambda}{n},\qquad \text{(Equation 3)}$$

for the absorption of semiconductor layer 33 to be improved.

Figure 6:
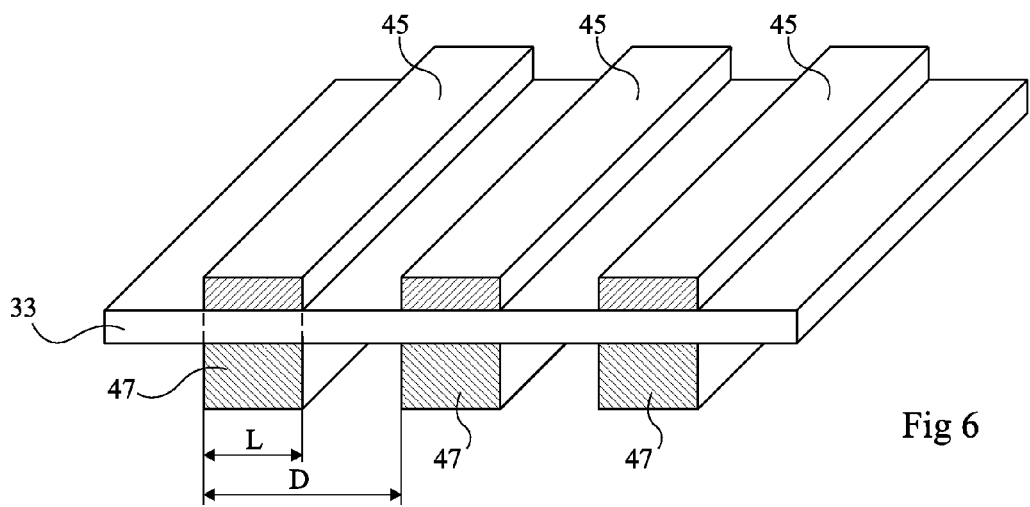

FIG. 6 illustrates a variation of a photodetector comprising a thin semiconductor layer 33 at the surface of which is formed an array of rectangular pads 45 having at least its width L complying with equation (1) or (2). Period D of pads 45, at the surface of layer 33, complies with equation (3). On the lower surface of semiconductor 33 is formed an array of strips 47 which are located at least in front of pads 45. Plasmon modes thus appear at the semiconductor-metal interfaces.

It should be noted that the forming of rectangular pads 45 favors the absorption of a light beam polarized perpendicularly to the main direction of strips 45 (TM polarization). The forming of square pads such as pads 43 of FIG. 5 enables to have a photodetector which is little dependent on the polarization of the incident light beam. A photodetector intended to select one or the other of fundamental polarizations TE or TM can thus be formed.

FIGS. 7A and 7B are curves illustrating advantages of the photodetectors discussed herein.

FIG. 7A shows, according to the wavelength of an incident beam, two curves 51 and 53, respectively of reflective power R of a photodetector based on cadmium telluride mercury (CdHgTe or CMT) such as those discussed hereabove, and of absorption A of the semiconductor. The photodetector considered herein is sized to optimize the detection of a magnetic transverse polarized light beam having a 5,000-nm wavelength. To achieve this, the dimensions of the photodetector are selected such that equation (1) or (2), and if need be equation (3), are satisfied.

For a light beam having a 5,000-nm wavelength, the absorption in the CdHgTe layer of the photodetector is on the order of 0.77 and the reflective power is almost zero. Conversely to known plasmon photodetectors which have the disadvantage of having a very small detection band, the photodetector considered herein has an absorption which only relatively slightly decreases, and a reflective power which only relatively slightly increases, when the wavelength of the light beam varies by 200 nm around the 5,000-nm wavelength. The width at mid-height of the absorption peak is on the order of 1,700 nm, which is on the order of one third of the wavelength of the incident beam.

FIG. 7B shows two curves 55 and 57, respectively of reflective power R of a CdHgTe-based photodetector and of absorption A of the semiconductor in the case of a photodetector such as shown herein, according to the angle of incidence of the light beam, the photodetector being sized to correctly absorb the considered light beam. It should be noted, in curves 55 and 57, that a variation of angle of incidence θ of the light beam on the order of 50° almost does not vary the absorption and the reflective power of the photodetector.

Thus, the photodetectors of FIGS. 3 to 6 allow a wide-band detection, little dependent on the angle of incidence of the light beam. Further, the forming of a photodetector comprising a thin semiconductor layer enables to form small pixels properly insulated from one another.

Semiconductor layer 33, 39 may be provided to comprise different regions enabling to collect the photogenerated carriers. For example, it may be provided to locally form a vertical or horizontal PN junction in semiconductor layer 33, 39 or again a structure of vertical or horizontal PIN diode type (not shown). In this case, the photogenerated electrons may be stored in the N-type doped regions of the semiconductor layer and the detection is performed by transferring these electrons to an electronic circuit, for example, by means of a transfer transistor.

Once the charges have been formed in semiconductor portion 33 or 39, several solutions are possible to read these charges.

A first solution comprises polarizing one or several ones of metal pads 37, 43, 45 formed at the surface of the semiconductor layer to a first voltage and of polarizing the layer or the lower pads 31, 47 to a second voltage. The flowing of a current resulting from this polarization is then representative of the illumination of the photodetector. A variation comprises polarizing one or several metal pads 43, 45, at the surface of semiconductor layer 33, 39 to a first voltage and polarizing other metal pads 43, 45 to a second voltage. The detection is then only performed from the upper surface of the photodetector.

FIGS. 8A, 8B, and 8C show three possible variations of this last case, and more specifically three possible structures of the metal pads formed at the surface of a semiconductor layer 33 and allowing the photodetection.

In the example of FIG. 8A, the metal pads formed at the surface of the semiconductor layer are separated in two assemblies 61 and 63 having a basic comb shape, combs 61 and 63 being interdigited. Each comb 61 and 63 comprises a main strip from which secondary strips extend. Combs 61 and 63 are provided so that the width of the main strip and of the secondary strips complies with equation (1) or (2). The secondary strips have a period complying with equation (3).

In the example of FIG. 8B, the metal pads formed at the surface of semiconductor layer 33 are separated in two sets of fingers 65 and 67. Each set of fingers is formed of a main strip and of secondary fingers which extend from the main strip with a substantially circular shape. The main strips and the secondary fingers comply with equations (1) or (2) and (3).

In the example of FIG. 8C, square pads 68, distributed in an array at the surface of a semiconductor layer 33, are not polarized. The dimensions and the period of pads 68 comply with equations (1) or (2) and (3). Pads 68 are surrounded with two electrodes 69A and 69B enabling the collection.

FIG. 9 illustrates an alternative embodiment of a photodetector. The photodetector comprises a semiconductor layer 33 on which are formed pads 73, 75, and 77 made of metal or of a material having a negative permittivity over the considered frequency band. Under layer 33, at least in front of pads 73, 75, and 77, are formed metal portions 71. Pads 73, 75, and 77 have different widths at the surface of semiconductor layer 33. Since the pad width is linked to the wavelength of the photo-detected light, pads 73, 75, and 77 enable to detect light having different wavelengths. Thus, the photodetector of FIG. 9 enables to selectively detect three light beams of different wavelengths.

In FIG. 9, a transparent layer 79 is formed on the photodetector. This layer enables to protect the photodetector. It should be noted that such a layer may be provided on each of the previously-described variations. This layer may also have a shape capable of focusing the incident light beams towards each elementary detector (semi-spherical lens shape above each pad 73, 75, 77, for example).

The previously-described photodetectors may be used, for example, to form a color image sensor. Each elementary photodetector of the image sensor then comprises pads 73, 75, 77 sized to detect a given color (red, green, blue). These photo-detectors are assembled in an array of color pixels. As an example of dimensions, the largest elementary photodetector, intended to detect red light waves ($\lambda \approx 600$ nm), comprising a silicon layer ($n \approx 4$), will comprise a pad having at least one dimension on the order of 50 nm. This dimension is particularly small as compared with current dimensions of conventional photodetectors where electron/hole pairs are directly created in a semiconductor layer. Further, the "insulation" between elementary photodetectors is simple to achieve and takes up a minimum surface area due to the fact that an extremely thin semiconductor layer is difficult to interrupt. A multispectral image sensor other than a color sensor may similarly be provided.

Specific embodiments of the present invention have been described. Various alterations and modifications will occur to those skilled in the art. In particular, although photodetectors comprising upper pads and a lower layer made of a metal have been described herein, it should be understood that the variation in which the photodetector comprises upper pads and a lower layer of a material having a negative permittivity at the considered frequency may be applied to each of the variations described herein.

The invention claimed is:

1. A photodetector comprising at least a portion of a semiconductor layer formed directly on at least a portion of a reflective layer and intended to be illuminated by a light beam, a plurality of square or rectangular pads, each without holes formed therein, arranged periodically on the portion of the semiconductor layer opposite to the reflective layer portion, the pad and the portion of the reflective layer being metallic or made of a material having a negative permittivity, optical cavities formed between said at least a portion of the reflective layer and said plurality of square or rectangular pads having a thickness strictly smaller than one quarter of the ratio of the wavelength of the light beam to the optical index of the semiconductor layer, the semiconductor layer being a layer of constant thickness.

2. The photodetector of claim 1, wherein at least one dimension of the pad, in a plane parallel to the semiconductor layer, is smaller than the ratio of the wavelength of the light beam to twice the optical index of the semiconductor layer.

3. The photodetector of claim 1, wherein the plurality of square or rectangular pads are arranged periodically according to a period smaller than 0.75 $\lambda$/n, $\lambda$ being the wavelength of said light beam, n being the optical index of the semiconductor layer.

4. The photodetector of claim 1, further comprising a layer of a transparent material covering the photodetector.

5. The photodetector of claim 1, further comprising a bonding layer, and/or a layer with an index gradient, at the interface between the reflective layer and the semiconductor layer.

6. The photodetector of claim 1, wherein the pad(s) and the reflective layer are made of a metal capable of creating, when the semiconductor layer is illuminated, a cavity plasmon mode in this semiconductor layer.

7. The photodetector of claim 6, wherein the reflective layer is made of a metal having a thickness greater than the skin depth of this metal, for the wavelength of said light beam.

8. The photodetector of claim 7, wherein the metal pad(s) have a thickness ranging between once and three times the skin depth of the metal forming them, for the wavelength of said light beam.

9. The photodetector of claim 1, wherein the pad(s) and the reflective layer are made of a material having a negative permittivity that forms, when the semiconductor layer is illuminated, phonons at the interface between said material and the semiconductor layer.

10. A multispectral image sensor comprising several elementary photodetectors of claim 1, the dimensions of the pad(s) of each elementary photodetector being adapted to the spectrum to be detected.

11. The photodetector of claim 1, the optical cavities formed between said at least a portion of the reflective layer and said plurality of square pads having a thickness on the order of one-tenth the ratio of the wavelength of the light beam to the optical index of the semiconductor layer.

* * * * *